(12) United States Patent
Shimura et al.

(10) Patent No.: US 9,265,156 B2
(45) Date of Patent: Feb. 16, 2016

(54) CURABLE COMPOSITION, CURED COATING FILM PREPARED FROM CURABLE COMPOSITION, AND PRINTED WIRING BOARD INCLUDING THE CURED FILM

(71) Applicant: TAIYO INK MFG. CO., LTD., Hiki-gun (JP)

(72) Inventors: Masayuki Shimura, Hiki-gun (JP); Yoshiyuki Furuta, Hiki-gun (JP); Masao Yumoto, Osato-gun (JP); Shoji Minegishi, Hiki-gun (JP)

(73) Assignee: Taiyo Ink Mfg. Co., Ltd., Hiki-gun (JP)

( * ) Notice: Subject to any disclaimer, the term of this patent is extended or adjusted under 35 U.S.C. 154(b) by 23 days.

(21) Appl. No.: 14/227,249

(22) Filed: Mar. 27, 2014

(65) Prior Publication Data
US 2014/0290990 A1  Oct. 2, 2014

(30) Foreign Application Priority Data

Mar. 29, 2013 (JP) .................................. 2013-074507
Nov. 26, 2013 (JP) .................................. 2013-243864

(51) Int. Cl.
| C08F 2/46 | (2006.01) |
| C08G 61/04 | (2006.01) |
| H05K 3/28 | (2006.01) |
| H05K 1/03 | (2006.01) |

(52) U.S. Cl.
CPC .............. *H05K 3/287* (2013.01); *H05K 1/0393* (2013.01); *H05K 2201/0154* (2013.01); *H05K 2203/013* (2013.01)

(58) Field of Classification Search
CPC ................ H05K 3/287; H05K 1/0393; H05K 2201/0154; H05K 2203/013

USPC .................... 522/33, 6, 71, 189, 184, 1; 520/1
See application file for complete search history.

(56) References Cited

U.S. PATENT DOCUMENTS

2009/0030132 A1* 1/2009 Kumazawa et al. .......... 524/493

FOREIGN PATENT DOCUMENTS

| JP | 1-121364 | | 5/1989 |
| JP | 5-75032 | | 3/1993 |
| JP | 9-54434 | | 2/1997 |
| JP | 10-224018 | * | 8/1998 |
| JP | 2011-57751 | A | 3/2011 |

OTHER PUBLICATIONS

Fukuda et al, JP 10-224018 Machine Translation, Aug. 21, 1998.*
U.S. Appl. No. 14/501,962, filed Sep. 30, 2014, Shimura, et al.
U.S. Appl. No. 14/501,630, filed Sep. 30, 2014, Shimura, et al.
Japanese Office Action issued Apr. 8, 2014 in Patent Application No. 2013-243864.
Office Action issued Jun. 11, 2015 in Korean Patent Application No. 10-2014-0032729.

* cited by examiner

*Primary Examiner* — Ling Choi
*Assistant Examiner* — Jessica E Whiteley
(74) *Attorney, Agent, or Firm* — Oblon, McClelland, Maier & Neustadt, L.L.P.

(57) ABSTRACT

A curable composition to be used for a printed wiring board is disclosed, which has an excellent flexibility and an excellent adhesive property with respect to both a plastic substrate and a conductive layer in the printed wiring board. The curable composition includes (A) a (meth)acrylate compound having a polyene structure, (B) a (meth)acrylate compound having a hydroxyl group; and (C) a photopolymerization initiator. From the curable composition, a cured coating film, and a printed wiring board including the cured coating film in the form of a predetermined pattern are obtained.

20 Claims, No Drawings

CURABLE COMPOSITION, CURED COATING FILM PREPARED FROM CURABLE COMPOSITION, AND PRINTED WIRING BOARD INCLUDING THE CURED FILM

CROSS REFERENCE TO RELATED APPLICATIONS AND INCORPORATION BY REFERENCE

This application is based upon and claims the benefit of priority from the prior Japanese Patent Application No. 2013-074507, filed on Mar. 29, 2013 and Japanese Patent Application No. 2013-243864, filed on Nov. 26, 2013; the entire contents of which are incorporated herein by reference.

BACKGROUND OF THE INVENTION

1. Field of the Invention

The present invention relates to a curable composition to be used for a printed wiring board, in particular a UV curable composition for use in inkjet printing method, a cured coating film to be used for a printed wiring board as a resist, or for marking or etching, and a printed wiring board comprising the cured film having a predetermined pattern.

2. Discussion of the Related Art

For the production of a flexible printed wiring board or a tape carrier package, the following types of resists are used:
(1) A resist obtained by stamping a polyimide film, i.e., so-called cover lay film, with a mold in the shape corresponding to a resist pattern to be obtained, adhering the stamped film to a substrate by using an adhesive agent, and curing the film, as disclosed JP-B (Kokoku) 5 (1993)-75032;
(2) A resist obtained by applying a photocurable composition to a substrate by screen printing to form a flexible film, and curing the film, as disclosed in JP-A 10 (1998)-224018;
(3) A resist obtained by applying a photocurable and thermosetting resin composition to a substrate, and exposing the composition to light, developing and curing the same, as disclosed in JP-A 9 (1997)-54434.

Among these, photocurable composition (2) is preferably used, which is prepared with small number of pattern forming steps and short tact time, especially because of fast setting.

It is necessary, for the above-mentioned curable compositions, to secure adhesion with respect to both plastic substrate based on polyimide or the like and a metal for a conductive circuit provided on the substrate. In addition to the above, the curable compositions have to have many necessary properties such as resistant to soldering. The film obtained from photocurable composition disclosed in JP-A 10 (1998)-224018, however, has insufficient flexibility. Therefore, it is difficult to obtain an excellent adhesion with respect to both a plastic substrate and metal as a conductive circuit, and hence a further improvement is desired.

OBJECT AND SUMMARY OF THE INVENTION

It is therefore an object of the present invention to provide a curable composition having an excellent flexibility, and an excellent adhesion with respect to both a substrate and a metal as a conductive circuit, with maintaining properties necessary for a resist such as a resistance to soldering, after solving conventional drawbacks seen in prior art as mentioned above.

Another object of the present invention is to provide a cured coating film having a predetermined pattern/shape, prepared by using the above-mentioned curable composition having an excellent flexibility, and an excellent adhesion with respect to both the plastic substrate and the metal as the conductive circuit, and a printed wiring board having a pattern obtained by curing the curable composition to be used for the printed wiring board.

It was found that the above mentioned object of the present invention is achieved by a curable composition to be used for a printed wiring board comprising a (meth)acrylate compound having a polyene structure, a (meth)acrylate compound having a hydroxyl group; and a photopolymerization initiator.

In other words, a curable composition to be used for a printed wiring board is characterized by comprising (A) a (meth)acrylate compound having a polyene structure, (B) a (meth)acrylate compound having a hydroxyl group; and (C) a photopolymerization initiator.

In the curable composition according to the present invention, it is preferable that the polyene structure in (meth)acrylate compound (A) is prepared by homopolymerization of butadiene or isoprene, or copolymerization of butadiene with isoprene.

The polyene structure in (meth)acrylate compound (A) as a repeating unit is preferably represented by general formula (I):

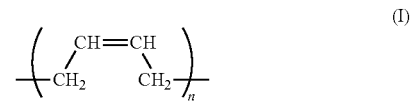

wherein n is an integer in the range of 10 to 300.

Moreover, the curable composition to be used for a printed wiring board according to the present invention preferably comprises a bifunctional (meth)acrylate compound which is free from a hydroxyl group. The bifunctional (meth)acrylate compound which is free from a hydroxyl group has a viscosity in the range of 5 to 50 mPa·s at 25° C.

Further, it is preferable that the curable composition to be used for a printed wiring board of the present invention further comprises a thermosetting component.

Furthermore, it is preferable that the curable composition to be used for a printed wiring board of the present invention has a viscosity at 50° C. in the range of 5 to 50 mPa·s.

A cured coating film according to the present invention is characterized by being obtained by irradiating light to the above-discussed curable composition of the invention.

A printed wiring board is characterized by comprising a substrate, and a cured coating film in the form of a predetermined pattern, prepared by printing the substrate with the curable composition of the present invention and irradiating a light to the curable composition.

For the printed wiring board, it is preferable that the substrate is made of a plastic.

Other features of this invention will become apparent in the course of the following description of exemplary embodiments, which are given for illustration of the invention and are not intended to be limiting thereof.

DETAILED DESCRIPTION OF THE INVENTION

In the present invention, a curable composition which is appropriately used for a printed wiring board is obtained (which hereinafter is also referred to as curable composition) comprises (A) a (meth)acrylate compound having a polyene structure (component A), (B) a (meth)acrylate compound having a hydroxyl group (component B); and (C) a photopolymerization initiator (component C).

In the description, (meth)acrylate is a generic word referring to acrylate, methacrylate and a mixture of these. The other similar expression is understood in a similar way.

[(A) (Meth)Acrylate Compound Having Polyene Structure]

It is preferable that the polyene structure in (meth)acrylate compound (component A) is prepared by a polymerization of a repeating unit/units including butadiene, isoprene, or both of these, in particular a repeating unit represented by general formula (I):

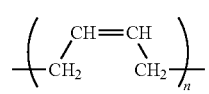

wherein n is an integer in the range of 10 to 300.

Resulting from the repeating units, flexibility is imparted to a curable composition for a printed curable board. Therefore, following up performance and hence a good adhesive ness with respect to a substrate can be obtained even after the composition is cured.

The polyene structure of (meth)acrylate compound (component A) includes the repeating units preferably at a ratio of 50% or more, more preferably 80% or more, based on the polyene structure.

Further, the polyene structure of (meth)acrylate compound (component A) may include a unit represented by formula (II):

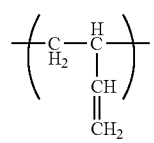

Meth(acrylate) compound (component A) having the polyene structure has a molecular weight, in general, in the range of 700 to 15,000, and preferably in the range of 1,000 to 12,000.

More specifically, the following materials are preferably used:

liquid polybutadiene urethane (meth)acrylate obtained from 2-hydroxylethyl (meth)acrylate, 2,4-tolylenediisocyanate, and a hydroxyl-group containing liquid polybutadiene, by urethane forming addition reaction via isocyanate groups on 2,4-tolylenediisocyanate;

liquid polybutadiene acrylate obtained by esterification reaction of maleic anhydride-modified polybutadiene with 2-hydroxyacrylate;

liquid polybutadiene (meth)acrylate obtained by ester formation reaction of a carboxyl group from maleic anhydride-modified polybutadiene with an epoxy group of glycidyl (meth)acrylate:

liquid polybutadiene (meth)acrylate obtained by reacting epoxydizing agent with liquid polybutadiene to give epoxidized polybutadiene, and then subjecting the epoxidized polybutadiene to ester formation reaction with (meth)acrylic acid; and liquid polybutadiene (meth)acrylate obtained by reaction of a liquid polybutadiene having a hydroxyl group with (meth)acryloyl chloride after dechlorination thereof and urethane(meth)acrylate modified-liquid hydrogenated 1,2-polybutadiene (meth)acrylate, wherein 1,2-polybutadieneglycol has been obtained by hydrogenating a liquid polybutadiene having a hydroxyl group at each end of the molecule with respect to the unsaturated double bond.

Examples of the commercially available products are NISSO PB TE-2000, NISSO PB TEA-1000, NISSO PB TE-3000, and NISSO PB TEAI-1000 (manufactured by Nippon Soda Co., Ltd.); CN301, CN303, CN307 (manufactured by Sartomer USA, LLC), BAC-15 (Osaka Organic Chemical Industry Ltd.), BAC-45 (Osaka Organic Chemical Industry Ltd.), and EY RESIN BR-45UAS (Light Chemical Industries Co., Ltd.).

(Meth)acrylate compound (component A) having a polyene structure is contained in an amount in the range of 3 to 70 wt. %, preferably in the range of 10 to 45 wt. % in the curable composition.

When (meth)acrylate compound (A) having a polyene structure is contained in the composition in an amount of less than 3 wt. %, it is possible that the adhesive property with respect to a substrate, which is a characteristic feature of the composition, is not obtained. Therefore, this is not preferred. While when (meth)acrylate compound (A) is contained in the composition in an amount of more than 70 wt. %, it is possible that the ink component is separated from the other components in the composition.

(Meth)acrylate compound (component A) can be used alone or in combination of two or more kinds of component A.

[(B) (Meth)Acrylate Compound Having Hydroxyl Group]

As a (meth)acrylate compound as a component B, a low-molecular weight material such as a monomeric or an oligomeric material, specifically those having a molecular weight in the range of 100 to 1000, more preferably in the range of 110 to 700 are used.

Specific examples of (meth)acrylate compound having a hydroxyl group (component B) are 2-hydroxy-3-acryloyoxypropyl (meth)acrylate, 2-hydroxy-3-phenoxyethyl (meth)acrylate, 1,4-cyclohexandimethanol mono(meth)acrylate, 2-hydroxyethyl (meth)acrylate, 2-hydroxypropyl (meth)acrylate, 4-hydroxybutyl (meth)acrylate, pentaerythritol (meth)acrylate, dipentaerythritol monohydroxypenta(meth)acrylate, and 2-hydroxypropyl (meth)acrylate. Commercially available (meth)acrylate compounds are, for example, ARONICS M-5700 (trade name; manufactured by TOAGOSEI Co., Ltd.), 4HBA, 2HEA, CHDMMA (trade name; manufactured by Nippon Kasei Chemical Co., Ltd), BHEA, HPA, HEMA, HPMA (trade name; manufactured by Nippon Shokubai Co., Ltd), light ester HO, light ester HOP, and light ester HOA (trade name; manufactured by Kyoeisha Chemical Co. Ltd.).

(Meth)acrylate compound having a hydroxyl group (component B) can be used alone or in combination of two or more kinds of component B.

Of these, particular preference is give to 2-hydroxy-3-acryloyloxypropyl acrylate, 2-hydroxy-phenoxyethyl acrylate, 2-hydroxyethyl acrylate, 2-hydroxypropyl acrylate, 4-hydroxybutyl acrylate, and 1,4-cyclohexanedimethanol monoacrylate.

(Meth)acrylate having a hydroxyl group (component B) is contained, preferably in the range of 5 to 50 parts by weight, more preferably in the range of 10 to 30 parts by weight, based on 100 parts by weight of the composition. When (meth)acrylate (B) having a hydroxyl group is contained in an amount of 5 parts by weight or more, based on 100 parts by weight of the composition, an excellent adhesive property, which is a characteristic feature of the composition according to the present invention, is obtained. While component B is contained in an amount of 50 parts by weight or less, based on 100 parts by weight of the composition, it is possible to prevent the ink from the compatibility degradation.

The curable composition of the present invention has an excellent adhesive property with respect to both a plastic substrate and a metal of a conductor circuit, and shows an excellent substrate-protection performance as a resist ink such as an etching resist ink, solder resist ink, and plating resist ink for the application to a printed wiring board, because of the combination of the component A and the component B. Moreover, the curable composition exerts excellent properties as a cured coating film.

[(C) Photopolymerization Initiator]

In the present invention, a photopolymerization initiator such as a photoradical polymerization initiator can be used, although there is no particular limitation for the photopolymerization initiator to be used. Any photoradical polymerization initiator which generates radicals by irradiation of light, laser, or electron beam thereto, and initiates radical polymerization reaction.

Examples of the photoradical initiator include:

benzoins and benzoin alkyl ethers such as benzoin, benzoin methyl ether, benzoin ethyl ether, benzoin isopropyl ether;

alkyl phenones such as -hydroxy-2-methyl-1-phenyl-propan-1-one;

acetophenones such as acetophenone, 2,2-dimethoxy-2-phenyl acetophenone, 2,2-diethoxy-2-phenyl acetophenone, 1,1-dichloroacetophenone;

aminoacetophenones such as 2-methyl-1-[4-(methylthio) phenyl]-2-morpholinopropan-1-one, 2-benzyl-2-dimethylamino-1-(4-morpholinophenyl)-butan-1-one, and N,N-dimethylaminoacetophenone;

anthraquinones such as 2-methylanthraquinone, 2-ethylanthraquinone, 2-t-butyl anthraquinone, 1-chloroanthraquinone;

thioxanthones such as 2,4-dimethylthioxanthone, 2,4-diethylthioxanthone, 2-chlorothioxanthone, 2,4-diisopropyl thioxanthone;

ketals such as acetophenone dimethyl ketal, benzyl dimethyl ketal;

2,4,5-triarylimidazole dimers;

riboflavin tetrabutylate, thiol compounds such as 2-mercaptobenzimidazole, 2-mercaptobenzoxazole, and mercaptobenzothiazole;

organic halogen compounds such as 2,4,6-tris-triazine; 2,2,2-tribromoethanol, tribromomethyl phenyl sulfone;

benzophenones or xanthones such as benzophenone, 4,4'-bisdiethylaminobenzophenone;

acylphosphine oxides such as 2,4,6-trimethylbenzokyl diphenyl phosphine oxide, and bis(2,4,6-trimethylbenzoyl)-phenylphosphine oxides, and titanocenes such as bis(cyclopentadienyl)-di-phenyl titanium, bis(cyclopentadienyl)-di-chloro-titanium, bis(cyclopentadienyl)-bis(2,3,4,5,6-pentafluorophenyl)titanium, bis(cyclopentadienyl)-bis(2,6-difluoro-3-(pyrol-1-yl)phenyl) titanium.

These known photo polymerization initiator may be used alone or as a mixture of two or more species. Furthermore, it is possible to add a photo-initiator auxiliary such as N,N-dimethylamino benzoic acid ethyl ester, N,N-dimethylamino benzoic acid isoamyl ester, pentyl-4-dimethylamino benzoate, tertiary amines such as triethylamine and triethanolamine.

Examples of the commercially available photoinitiators are Irgacure 261, 184, 369, 651, 500, 819, 907, 784, 2959, Darocure1116, 1173, CGI1700, CGI1750, CGI1850, CG-24-61, LUCILIN TPO (trade names, manufactured by BASF Japan), DAICATII (trade name, manufactured by Daicel Corporation), UVAC1591 (trade name, manufactured by Daicel UCB Co., Ltd.), Rhodorsil Photoinitiator 2074 (trade name, manufactured by Rhodia Japan, Ltd.), UbecrylP36 (manufactured by UCB Chemicals, Inc.), EsacureKIP150, KIP65LT, KIP100F, KT37, KT55, KT046, KIP75/B, ONE (trade names, manufactured by fratelli lamberti di a. lamberti & g. snc).

The amount of the photoinitiator (C) to be added is appropriately in the range of 0.5 to 10 wt. % with respect to the composition.

(Bifunctional (Meth)acrylate Compound)

It is preferable that the curable composition for the printed wiring board according to the present invention further comprises bifunctional (meth)acrylate compound (except for those having a hydroxyl group). By adding bifunctional (meth)acrylate compound (except for those having a hydroxyl group), it is possible to further improve the compatibility of the components in the curable composition for the printed wiring board.

Specific examples of the bifunctional (meth)acrylate compounds are:

diol diacrylate such as 1,4-butanediol diacrylate, 1,6-hexanediol diacrylate, 1,9-nonanediol diacrylate, 1,10-decanediol diacrylate;

glycol diacrylate such as ethylene glycol diacrylate, diethylene glycol diacrylate, triethylene glycol diacrylate, tetraethylene glycol diacrylate, polyethylene glycol diacrylate, dipropylene glycol diacrylate, dipropylene glycol diacrylate, polypropylene glycol diacrylate, neopentyl glycol diacrylate, diol diacrylates obtained by adding at least one of ethylene oxide or propylene oxide to neopentyl glycol, caprolactone modified neopentyl glycol hydroxypivalate diacrylate;

diacrylate having a ring-shaped structure such as bisphenol A EO added diacrylate, bisphenol A PO added diacrylate, tricyclodecanemethanol diacrylate, hydrogenated dicyclopentadienyl diacrylate, cyclohexyl diacrylate, Examples of the commercially available products of the bifunctional (meth)acrylate are light acrylate 1,6-HX-A, 1,9-ND-A, 3EG-A, 4EG-A (trade name; manufactured by Kyoeisha Chemical Co. Ltd.), HDDA, 1,9-NDA, DPGDA, TPGDA (trade names, manufactured by Daicel-Cytec Ltd.), BISCOAT#195, #230, #230D, #260, #310HP, #335HP, #700HV, #540 (trade names, manufactured by Osaka Organic Chemical Industry Ltd), ARONICS M-208, M-211B, M-215, M-220, M-225, M-240, M-270 (trade name; manufactured by TOAGOSEI Co., Ltd.).

Among these, diol diacrylates having an alkylene chain including 4 to 12 carbon atoms, in particular 1,4-butanediol diacrylate, 1,6-hexanediol diacrylate, 1,9-nonanediol diacrylate, 1,10-decanediol diacrylate are preferably in view of the viscosity and the compatibility to the other components.

These bifunctional acrylates are added to the composition in an amount in the range of 20 to 80 parts by weight, more preferably in the range of 40 to 70 parts by weight, based on 100 parts by weight of the composition.

When the bifunctional (meth)acrylate is added in an amount of 20 parts by weight or more, with respect to 100 parts by weight of the composition, the solubility of the components in the composition will be improved. On the other hand, when the bifunctional (meth)acrylate is added in an amount of 80 parts by weight or less, with respect to 100 parts by weight of the composition, the adhesive property of the components in the composition will be improved.

The viscosity of the bifunctional (meth)acrylate compound at 25° C. is in the range of 5 to 50 mPa·s, and particularly in the range of 5 to 30 mPa·s. In the above-mentioned viscosity range, the bifunctional (meth)acrylate is efficiently treated as a diluent, by which components in the composition according to the present invention can be uniformly mixed.

As a result, it is expected that the entire surface of the coatings from the composition is uniformly adhered to the substrate.

(Thermosetting Composition)

To the photocurable resin composition for the printed wiring board according to the present invention, a thermosetting component (E) may be further added. By adding a thermosetting component (E), the adhesive property and the heat resistance of the composition are expected to be improved. Examples of such thermosetting component that can be used in the present invention include amino resins such as melamine resins, benzoguanamine resins, melamine derivatives and benzoguanamine derivatives; blocked isocyanate compounds; cyclocarbonate compounds; a thermosetting component including a ring-shaped (thio)ether group, multifunctional epoxy compounds; multifunctional oxetane compounds; and known thermosetting resins such as bismaleimide and carbodiimide resins. Among these, the block isocyanate compounds are particularly preferred, because of the storage stability.

The above-described thermosetting component having a plurality of cyclic (thio)ether groups in the molecule is a compound having one or more of 3-, 4- and 5-membered cyclic (thio)ether groups in the molecule, and examples thereof include compounds having a plurality of epoxy groups in the molecule, that is, multifunctional epoxy compounds; compounds having a plurality of oxetanyl groups in the molecule, that is, multifunctional oxetane compounds; and compounds having a plurality of thioether groups in the molecule, that is, episulfide resins.

Examples of the above-described multifunctional epoxy compounds include epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Chemical Industries, Ltd., EPICLON 840, EPICLON 850, EPICLON 1050 and EPICLON 2055, which are manufactured by DIC Corporation, EPOTOHTO YD-011, YD-013, YD-127 and YD-128, which are manufactured by Tohto Kasei Co., Ltd., D.E.R.317, D.E.R.331, D.E.R.661 and D.E.R.664, which are manufactured by The Dow Chemical Company, SUMI-EPDXY ESA-011, ESA-014, ELA-115 and ELA-128, which are manufactured by Sumitomo Chemical Co., Ltd., and A.E.R.330, A.E.R.331, A.E.R.661 and A.E.R.664, which are manufactured by Asahi Chemical Industry Co., Ltd. (all of the above are trade names); hydroquinone-type epoxy resin YDC-1312, bisphenol-type epoxy resin YSLV-80XY and thioether-type epoxy resin YSLV-120 TE (all of which are manufactured by Tohto Kasei Co., Ltd.); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by Tohto Kasei Co., Ltd., D.E.R.542 manufactured by The Dow Chemical Company, SUMI-EPDXY ESB-400 and ESB-700, which are manufactured by Sumitomo Chemical Co., Ltd., and A.E.R.711 and A.E.R.714, which are manufactured by Asahi Chemical Industry Co., Ltd. (all of the above are trade names); novolac-type epoxy resins such as EPOTOHTO YDCN-701 and YDCN-704, which are manufactured by Tohto Kasei Co., Ltd., EPPN-201, EOCN-1025, EOCN-1020, EOCN-104S and RE-306, which are manufactured by Nippon Kayaku Co., Ltd., SUMI-EPDXY ESCN-195X and ESCN-220, which are manufactured by Sumitomo Chemical Co., Ltd., and A.E.R.ECN-235 and ECN-299, which are manufactured by Asahi Chemical Industry Co., Ltd., (all of the above are trade names); bisphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004 which are manufactured by Tohto Kasei Co., Ltd. (all of the above are trade names); hydrogenated bisphenol A-type epoxy resins such as EPOTOHTO ST-2004, ST-2007 and ST-3000 (trade names) which are manufactured by Tohto Kasei Co., Ltd.; glycidyl amine-type epoxy resins such as jER604 manufactured by Mitsubishi Chemical Corporation, EPOTOHTO YH-434 manufactured by Tohto Kasei Co., Ltd. and SUMI-EPDXY ELM-120 manufactured by Sumitomo Chemical Co., Ltd. (all of the above are trade names); hydantoin-type epoxy resins; alicyclic epoxy resins such as CELLOXIDE 2021 (trade name) manufactured by Daicel Corporation; trihydroxyphenyl methane-type epoxy resins such as YL-933 manufactured by Mitsubishi Chemical Corporation and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by Tohto Kasei Co., Ltd.; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; epoxy-modified polybutadiene rubber derivatives (for example, PB-3600 manufactured by Daicel Chemical Industries, Ltd.); and CTBN-modified epoxy resins (for example, YR-102 and YR-450 manufactured by Tohto Kasei Co., Ltd.). However, the multifunctional epoxy compounds are not restricted to the above. These epoxy resins may be used individually, or two or more thereof may be used in combination. Among these resins, particularly preferred are novolac-type epoxy resins, bixylenol-type epoxy resins, biphenol-type epoxy resins, biphenol novolac-type epoxy resins, naphthalene-type epoxy resins, and mixtures thereof.

Examples of the multifunctional oxetane compounds include multifunctional oxetanes such as bis[(3-methyl-3-oxcetanylmethoxy)methyl]ether, bis[(3-ethyl-3-oxcetanyl-methoxy)methyl]ether, 1,4-bis[(3-methyl-3-oxcetanyl-methoxy)methyl]benzene, 1,4-bis[(3-ethyl-3- oxcetanylmethoxy)methyl]benzene, (3-methyl-3-oxcetanyl) methyl acrylate, (3-ethyl-3-oxcetanyl)methyl acrylate, (3-methyl-3-oxcetanyl)methyl methacrylate, (3-ethyl-3-oxcetanyl)methyl methacrylate, and oligomers and copolymers thereof. Further examples of the multifunctional oxetane compounds are etherification products of an oxetane alcohol and a resin having a hydroxyl group, such as a novolac resin, a poly(p-hydroxystyrene), a cardo-type bisphenol, a calixarene, a calix resorcin arene or a silsesquioxane. Other examples include copolymers of an unsaturated monomer having an oxetane ring and an alkyl(meth)acrylate.

Examples of the compounds having a plurality of cyclic thioether groups in the molecule include bisphenol A-type episulfide resin YL7000 manufactured by Mitsubishi Chemical Corporation. Further, for example, an episulfide resin, which has been prepared by the same synthesis method except that an oxygen atom of an epoxy group of a novolactype epoxy resin is substituted with a sulfur atom, can also be used.

Further, examples of other thermosetting component include amino resins such as melamine derivatives and benzoguanamine derivatives, for example, methylol melamine compounds, methylol benzoguanamine compounds, methylol glycoluril compounds and methylol urea compounds. Moreover, alkoxymethylated melamine compounds, alkoxymethylated benzoguanamine compounds, alkoxymethylated glycoluril compounds and alkoxymethylated urea compounds are obtained by converting the methylol group of the respective methylol melamine compounds, methylol benzoguanamine compounds, methylol glycoluril compounds and methylol urea compounds into an alkoxymethyl group. The type of this alkoxymethyl group does not have any particular restrictions, and examples thereof include methoxymethyl group, ethoxymethyl group, propoxymethyl group and butoxymethyl group. In particular, a melamine derivative having a formalin concentration of 0.2% or less, which is not harmful to human body and environment, is preferred.

Examples of commercially available products of the above-described thermosetting components include CYMEL 300, 301, 303, 370, 325, 327, 701, 266, 267, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components may be used individually, or two or more thereof may be used in combination.

Polyisocyanate compounds and blocked isocyanate compounds are compounds having a plurality of isocyanate groups or blocked isocyanate groups in one molecule. Herein, the term "blocked isocyanate group" refers to a group in which isocyanate group is protected and thus temporarily inactivated by a reaction with a blocking agent. When a blocked isocyanate compound is heated to a predetermined temperature, the blocking agent is dissociated to yield an isocyanate group. It has been confirmed that the curability of the photocurable resin composition and the toughness of the resulting cured product are improved by adding the above-described polyisocyanate compound or blocked isocyanate compound.

Examples of the polyisocyanate compound are an aromatic polyisocyanate, an aliphatic polyisocyanate or an alicyclic polyisocyanate.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate, as well as adducts, biurets and isocyanurates of the above-described isocyanate compounds.

As the blocked isocyanate compound, a product of an addition reaction between an isocyanate compound and an isocyanate blocking agent is employed. Examples of an isocyanate compound which can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may be a commercially available product and examples thereof include SUMIDUR BL-3175, BL-4165, BL-1100 and BL-1265, DESMODUR TPLS-2957, TPLS-2062, TPLS-2078 and TPLS-2117, and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). Herein, SUMIDUR BL-3175 and BL-4265 are products obtained by using methylethyl oxime as a blocking agent. The above-described compounds having a plurality of isocyanate groups or blocked isocyanate groups in one molecule may be used individually, or two or more thereof may be used in combination.

The content of such thermosetting component is preferably in the range of 1 to 30 parts by weight, based on 100 parts by weight of the entire composition. When the content is 1 part by weight or more based on 100 parts by weight of the composition, a coating film having a sufficient toughness and heat resistance is obtained. On the other hand, when the content is 30 parts by weight or less based on 100 parts by weight of the composition, the deterioration of the storage stability is minimized.

In the curable composition of the present invention, it is possible to add a conventional additive/additives such as surface tension regulator, surface active agent, matting agent, materials adjusting the physical properties of the coating film such as polyester resin, polyurethane resin, vinyl resin, acrylic resin, rubber resin and wax, known coloring agent such as phthalocyanine blue, phthalocyanine green, aiojin green, disazo yellow, crystal violet, titanium oxide, carbon black or naphthalene black, at least one of defoaming agent and leveling agent such as silicone-based, fluorine-based and high molecular weight material-based defoaming agent, and adhesion-imparting agent such as imidazole-based, thiazole-based, and triazole-based silane coupling agent.

The curable composition for a printed wiring board of the present invention is applicable to printing methods including screen printing method, inkjet method, clip coating method, float coating method, roll coating method, bar coater method, curtain coating method. When the composition is applied to the inkjet method, in particular, the viscosity of the composition at 50° C. is in the range of 5 to 50 mPa·s, and preferably in the range of 5 to 15 mPa·s, which makes it possible to carry out a smooth printing, without applying unnecessary load to an inkjet printer.

The term "viscosity" as used herein means the viscosity measured at an ordinary temperature (25° C.) or 50° C., in accordance with JIS K2283. When the viscosity at the ordinary temperature is 150 mPa·s, or at 50° C. is 5 to 50 mPa·s, printing by inkjet printing method is available.

In addition to the above, when the curable composition for printed wiring board according to the present invention is used as an ink for an inkjet method, the curable composition having the above-discussed formulation may be applied to a flexible wiring board by roll-to-roll printing method. In this case, a resist pattern can be speedily formed on the wiring board, if a light source for a light irradiation is attached to a position behind the inkjet printer.

The light irradiation is carried out by irradiating UV light or an active energy ray, preferably UV light. As the light source, for example, a low-pressure mercury lamp, a medium-pressure mercury lamp, a high-pressure mercury lamp, an ultrahigh pressure mercury lamp, a xenon lamp, or a metal halide lamp is appropriately used. Furthermore, an electron beam, $\alpha$-ray, $\beta$-ray, $\gamma$-ray, X-rays, and neutron ray can be used. After the light irradiation, a heat application for curing the composition may be added, when necessary. The temperature for the heat application is, for instance, in the range of 80 to 200° C. By the heat application in such range, the composition can be sufficiently cured. The curing period is, for instance, in the range of 10 to 100 minute.

Further, the curable composition for a printed wiring board of the present invention exhibits an excellent adhesive property with respect to a printed wiring board comprising a plastic substrate of which main component is polyimide or the like, and a conductive circuit provided on the plastic substrate. By using the curable composition of the invention, a cured coating film having an excellent properties including solder thermal resistance, chemical resistance, pencil hardness, resistance to non-electrolytic gold plating, and fold ability can be formed.

EXAMPLES

The present invention will now be explained in detail with referring to the Examples, which the present invention is not limited to. Without any special note, "part(s)" is based on mass, in the Examples.

Examples 1 to 11 and Comparative Examples 1 to 3

Curable compositions are prepared by blending the components in Table 1 in the amounts descried therein (unit: part(s)), and subjecting to a preliminary-mixing by a stirrer.

The thus prepared curable composition and the cured coating film obtained therefrom were subjected to the tests described below, to evaluate the properties.

1. Compatibility of the Curable Composition:

Each of the curable compositions (resist compositions) obtained in Examples 1 to 11 and Comparative Examples 1 to 3 was introduced to a transparent glass bottle and left standing still for one week. The presence of separation in the compositions is visually inspected. The evaluation was made based on the following standards:

○: Clear without separation
Δ: Turbid without separation
x: Separation observed
Measured results are shown in Table 2.

2. Set-to-Touch Property after UV Curing

Polyimide substrates (Upilex-S25) were coated with each of the curable compositions for a printed wiring board obtained by Examples 1 to 11 and Comparative Examples 1 to 3, by use of an applicator with a thickness of 30 μm (manufactured by Erichsen GmbH & Co. KG). The composition was cured with a high-pressure mercury lamp (HMW-713, manufactured by Orc manufacturing Co., Ltd) at 150 mJ/cm².

○: No tackiness
x: Tackiness observed.
Measured results are shown in Table 2.

3. Adhesion with Respect to Polyimide

Polyimide substrates (Upilex-S25) was coated with each of the curable compositions for a printed wiring board obtained by Examples 1 to 11 and Comparative Examples 1 to 3, by use of an applicator with a thickness of 30 μm (manufactured by Erichsen GmbH & Co. KG). The composition was cured with a high-pressure mercury lamp (HMW-713, manufactured by Orc manufacturing Co., Ltd) at 150 mJ/cm². Thereafter, the cured composition was subjected to a heat application treatment in a heat air circulation furnace at 150° C. for 60 minutes. The thus prepared samples were further subjected to a cross-cut adhesion test wherein tape peeling (JIS K5600) was carried out.

○: NO peel
x: Peel observed
Measured results are shown in Table 2.

4. Adhesion with Respect to Copper

Copper foil was coated with each of the curable compositions obtained by Examples 1 to 11 and Comparative Examples 1 to 3, by use of an applicator with a thickness of 30 μm (manufactured by Erichsen GmbH & Co. KG). The composition was cured with a high-pressure mercury lamp (HMW-713, manufactured by Orc manufacturing Co., Ltd) at 150 mJ/cm². Thereafter, the cured composition was subjected to a heat application treatment in a heat air circulation furnace at 150° C. for 60 minutes. The thus prepared samples were further subjected to a cross-cut adhesion test wherein tape peeling (JIS K5600) was carried out.

○: NO peel
x: Peel observed
Measured results are shown in Table 2.

5. Viscosity at 50° C.

The viscosities of the curable compositions obtained in Examples 1 to 11 and Comparative Examples 1 to 3 at 50° C., 100 rpm were measured by a cone-plate viscometer (TVH-33, manufactured by Toki Sangyo Co., Ltd.).

Based on the measurement, it was found that Examples 1 to 8, and 11, and Comparative Examples 1 to 3 had a viscosity in the range of 5 to 50 mPa·s.

6. Folding Property

A flexible copper-clad laminate (length: 110 mm, width: 60 mm, copper wire width/copper wire space width=200 μm/200 μm) was prepared from a polyimide film having a thickness of 25 μm and a copper wire (wiring pattern) in the shape of a comb made of a copper foil having a thickness of 12 μm. The flexible copper-clad laminate as a substrate was coated with the compositions prepared in Examples 1 to 11 and Comparative Examples 1 to 3 by means of inkjet printing by use of a piezo-driven inkjet printer. Accordingly, a coating film with a thickness of 15 μm was prepared on the substrate. Immediately after printing, the coating films were subjected to UV preliminary curing by a high-pressure mercury lamp attached to the print head of the inkjet printer. Thereafter, the coating films were cured by heating at 150° C. for one hour to give a sample. After being cured, the samples were repeatedly tested by MIT (Massachusetts Institute of Technology) tester (No. 307, manufactured by Yasuda Seiki. Seisakusho Ltd.), with the samples having a protective layer being folded so as to have the protective layer on the inward side. Namely, the cycle numbers when the electric conductivity was lost were obtained, by testing 3 samples for one evaluation, and calculating the average cycle numbers. The test conditions and the evaluation standards are as follows:

MIT Test Conditions:
  Loads: 500 gf
  Angle: 135° (angle made by left and right parts of test specimen)
  Speed: 175 times/min
  Tip: RO. 38 mm cylinder
Evaluation Standards:
  ○: 100 times or more
  Δ: 50 times or more, and less than 100 times
  x: less than 50 times 7. Resistance to Solvent The cured coating film obtained under the preparation condition at the above 4. was immersed in acetone for 30 minutes. Thereafter, the condition of the coating film was visually inspected, and evaluated in accordance with the following standard:
Evaluation Standard:
  ○: No change observed
  Δ: Slight change (whitening) observed
  x: Coating film swelled or peeled off 8. Resistance to Chemical The cured coating film obtained under the preparation condition at the above 4. was immersed in 5 wt % sulfuric acid aqueous solution for 10 minutes. Thereafter, the condition of the coating film was visually inspected, and evaluated in accordance with the following standard:
Evaluation Standard:
  ○: No change observed
  Δ: Slight change (whitening) observed
  x: Coating film swelled or peeled off 9. Resistance to Solder The cured coating film obtained under the preparation condition at the above 4. was immersed in a soldering pot at 260° C. for 10 minutes, in accordance with a method prescribed in JIS C-5012. After the thus treated sample was subjected to a pealing test by use of a cellophane adhesive tape, the condition of the coating film was visually inspected, and evaluated in accordance with the following standard:
Evaluation Standard:
  ○: No change of coating film observed
  Δ: Change of coating film observed
  x: Coating film peeled off 10. Resistance to Non-Electrolysis Plating Commercially available non-electrolytic nickel plating bath and non-electrolytic gold plating bath were used for gold plating with respect to a cured coating film obtained under the preparation condition at the above 4. Herein, nickel was plated with a thickness of 0.5 μm and gold was plated with a thickness of 0.03 μm. Thereafter, the condition of the coating film was visually inspected, and evaluated in accordance with the following standard:
Evaluation Standard:
  ○: No change observed
  Δ: Slight change observed
  x: Considerable whitening or haze observed

TABLE 1

|  | Component | Ex. 1 | Ex. 2 | Ex. 3 | Ex. 4 | Ex. 5 | Ex. 6 | Ex. 7 | Ex. 8 |
|---|---|---|---|---|---|---|---|---|---|
| EY RESIN BR-45UAS | (A) |  |  | 5 | 10 | 10 | 10 | 20 | 37.5 |
| BAC-45 | (A) | 10.00 | 20.00 |  |  |  |  |  |  |
| Polybutadiene (terminal hydrogen) |  |  |  |  |  |  |  |  |  |
| Light Acrylate 1,9-NDA | (D) | 50.00 | 40.00 | 55 | 50 | 50 | 60 | 40 | 22.5 |
| Light ester HO-250 | (B) |  |  | 20 | 20 |  | 20 | 20 | 20 |
| 4HBA | (B) | 20.00 | 20.00 |  |  | 20 |  |  |  |
| Darocure 1173 | (C) | 1.00 | 1.00 | 1 | 1 | 1 | 1 | 1 | 1 |
| 2-Ethyl AQ | (C) | 2.00 | 2.00 | 2 | 2 | 2 | 2 | 2 | 2 |
| Irgacure 819 | (C) | 2.00 | 2.00 |  |  |  |  |  |  |
| LUCILIN TPO | (C) |  |  | 2 | 2 | 2 | 2 | 2 | 2 |
| B17982 |  |  |  |  |  |  |  |  |  |
| BYK-307 |  | 0.10 | 0.10 | 0.1 | 0.1 | 0.1 | 0.1 | 0.1 | 0.1 |
| Σ |  | 85.10 | 85.10 | 110.5 | 85.1 | 85.1 | 95.1 | 85.1 | 85.1 |
| Content of component A |  | 11.8% | 23.5% | 4.5% | 11.8% | 11.8% | 10.5% | 23.5% | 44.1% |

|  | Component | Ex. 9 | Ex. 10 | Ex. 11 | Comp. Ex. 1 A not added | Comp. Ex. 2 A not added | Comp. Ex. 3 B not added |
|---|---|---|---|---|---|---|---|
| EY RESIN BR-45UAS | (A) | 30 | 60 |  |  |  | 10 |
| BAC-45 | (A) |  |  | 10.00 |  |  |  |
| Polybutadiene (terminal hydrogen) |  |  |  |  |  | 10 |  |

TABLE 1-continued

|  |  |  |  |  |  |  |  |
|---|---|---|---|---|---|---|---|---|
| Light Acrylate 1,9-NDA | (D) |  |  | 50.00 | 60 |  | 70 |
| Light ester HO-250 | (B) |  | 20 |  | 20 | 50 |  |
| 4HBA | (B) | 60 |  | 20.00 |  |  |  |
| Darocure 1173 | (C) | 1 | 1 | 1.00 | 1 | 1 |  |
| 2-Ethyl AQ | (C) | 2 | 2 | 2.00 | 2 | 2 | 2 |
| Irgacure 819 | (C) |  |  | 2.00 |  |  |  |
| LUCILIN TPO | (C) | 2 | 2 |  | 2 | 2 | 2 |
| B17982 |  |  |  | 10.00 |  |  |  |
| BYK-307 |  | 0.1 | 0.1 | 0.10 | 0.1 | 0.1 | 0.1 |
| Σ |  | 95.1 | 85.1 | 95.1 | 85.1 | 65.1 | 85.1 |
| Content of component A |  | 31.5% | 70.5% | 10.5% | 0.0% | 0.0% | 11.8% |

The product names and the abbreviation are as follows:
EY RESIN BR-45UAS: IPDI (isophorone isocyanate)-modified urethane acrylate (manufactured by Light Chemical Industries Co., Ltd)
BAC-45: acrylic modified butadiene (molecular weight: ca. 10000) (Osaka Organic Chemical Industry Ltd.)
Light acrylate 1,9-NDA: 1,9-nonandiol diacrylate (manufactured by Kyoeisha Kagaku K.K.)
Light Ester HO-250: 2-hydroxyethyl methacrylate (manufactured by Kyoeisha Kagaku K.K)
4HBA: 4-hydroxybutyl acrylate (manufactured by Nippon Kasei Chemical Co., Ltd)
Darocure 1173: 2-hydroxy-2-methyl-1-phenyl-propane-1-one (manufactured by BASF Japan)
2-Ethyl AQ: 2-ethyl anthraquinone (BASF Japan)
Irgacure 819: bis (2,4,6-trimethybenzoyl)-phenylphosphine oxide (manufactured by BASF Japan)
LUCILIN TPO: 2,4,6-trimethylbenzoyldiphenylphosphine oxide (manufactured by (BASF Japan),
BI7982; block isocyanate (Baxeden Chemicals Limited)
BYK-307: silicone-based additive (manufactured by BYK Japan KK)
EY RESIN BR-45 UAS: polybutadiene diol IPDI (isophorone)-modified urethane acrylate (manufactured by Osaka Organic Chemical Industry Ltd.)

TABLE 2

|  | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Comp. Ex. 1 | Comp. Ex. 2 | Comp. Ex. 3 |
|---|---|---|---|---|---|---|---|---|---|---|---|---|---|---|
| Solubility of Ink | ○ | ○ | ○ | ○ | ○ | ○ | ○ | ○ | Δ | Δ | ○ | ○ | Δ | ○ |
| UV curability | ○ | ○ | ○ | ○ | ○ | ○ | ○ | ○ | ○ | ○ | ○ | ○ | x | ○ |
| Polyimide adhesive property | ○ | ○ | ○ | ○ | ○ | ○ | ○ | ○ | ○ | ○ | ○ | x | ○ | x |
| Adhesive property to copper | ○ | ○ | ○ | ○ | ○ | ○ | ○ | ○ | ○ | ○ | ○ | ○ | x | ○ |
| Folding property | ○ | ○ | ○ | ○ | ○ | ○ | ○ | ○ | ○ | ○ | ○ | Δ | ○ | Δ |
| Resistance to solvent | ○ | ○ | ○ | ○ | ○ | ○ | ○ | ○ | ○ | ○ | ○ | Δ | Δ | ○ |
| Resistance to chemical | ○ | ○ | ○ | ○ | ○ | ○ | ○ | ○ | ○ | ○ | ○ | Δ | Δ | ○ |
| Thermal resistance to solder | ○ | ○ | ○ | ○ | ○ | ○ | ○ | ○ | ○ | ○ | ○ | Δ | Δ | ○ |
| Resistance to nonelectrolytic plating | ○ | ○ | ○ | ○ | ○ | ○ | ○ | ○ | ○ | ○ | ○ | Δ | Δ | ○ |

As shown in Table 2, curable compositions of claims 1 to 11 of the present invention for use in a printed wiring board exhibited excellent results, in terms of all the properties, i.e., solubility of curable composition, set-to-touch property after UV curing, adhesive property with respect to polyimide, adhesive property with respect to copper, pencil hardness, folding property, resistance to solvent, resistance to chemical, resistance to solder, and resistance to non-electrolytic gold plating.

In particular, Examples 1 to 8 and 11, where difunctional (meth)acrylate compound (component D) was used, in addition to components A to C exhibited excellent solubilities among each components in the curable compositions for use in a printed wiring board.

On the other hand, the curable compositions in comparative examples 1 to 3, wherein either of components A or B is not included, did not obtain good coating film properties regarding adhesive properties with respect to a polyimide substrate and adhesive properties after UV curing.

As explained above, the curable composition for use in a printed wiring board has excellent adhesive properties with respect to both a plastic substrate and a metal of conductive circuit, as well as various properties such as excellent flexibility, resistance to solder, resistance to solvent, resistance to chemical, pensile hardness, and resistance to nonelectrolytic gold plating, and is useful for obtaining excellent fine pattern.

The curable composition of the present invention is appropriately used as a composition for inkjet method. For the injection by means of inkjet printing method, the curable composition has to have a low viscosity. Generally speaking, it is considered that curable compositions, which have a low viscosity, are not always satisfactory in properties such as adhesive properties and thermal resistance. The curable composition of the present invention, however, is appropriately used for forming a solder resist pattern on a printed wiring board by an inkjet printing method, even when the curable composition has a low viscosity. Accordingly, the curable composition of the present invention can be used as a UV curable molding material, a material to be processed by photo fabrication such as laser lithography, and a material for 3D inkjet printing method.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A curable composition for a printed wiring board, comprising:

(A) a (meth)acrylate compound having a polyene structure;
(B) a (meth)acrylate compound having a hydroxyl group;
(C) a photopolymerization initiator; and
(D) at least one diol diacrylate having an alkylene chain selected from the group consisting of 1,9-nonanediol diacrylate and 1,10-decanediol diacrylate.

2. The curable composition for a printed wiring board as claimed in claim 1, wherein the polyene structure in the (meth)acrylate compound (A) is prepared by homopolymerization of butadiene or isoprene, or copolymerization of butadiene with isoprene.

3. The curable composition for a printed wiring board as claimed in claim 2, wherein the polyene structure contained in the (meth)acrylate compound (A) as a repeating unit is represented by general formula (I):

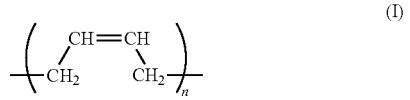

wherein n is an integer in the range of 10 to 300.

4. The curable composition for a printed wiring board as claimed in claim 1, further comprising a thermosetting component.

5. The curable composition for a printed wiring board as claimed in claim 1, wherein the curable composition has a viscosity at 50° C. in the range of 5 to 50 mPa·s.

6. A cured coating film obtained by irradiating light to the curable composition according to claim 1.

7. A printed wiring board comprising:
a substrate; and
a cured coating film in the form of a predetermined pattern, prepared by printing the substrate with the curable composition according to claim 1, and
irradiating a light to the curable composition.

8. The printed wiring board as claimed in claim 7, wherein the printing is performed by inkjet printing method.

9. The printed wiring board as claimed in claim 7, wherein the substrate is made of a plastic.

10. The curable composition for a printed wiring board as claimed in claim 1, wherein (D) the at least one diol diacrylate is 1,10-decanediol diacrylate.

11. The curable composition for a printed wiring board as claimed in claim 1, wherein (D) the at least one diol diacrylate comprises 1,9-nonanediol diacrylate and 1,10-decanediol diacrylate.

12. The curable composition for a printed wiring board as claimed in claim 1, wherein (D) the at least one diol diacrylate is 1,9-nonanediol diacrylate.

13. The curable composition for a printed wiring board as claimed in claim 1, wherein (A) the (meth)acrylate compound comprises at least one of isophorone isocyanate-modified urethane acrylate and acrylic modified butadiene, (B) the (meth)acrylate compound comprises at least one of 2-hydroxyethyl methacrylate and 4-hydroxybutyl acrylate, (C) the photopolymerization initiator comprises at least one of 2-hydroxy-2-methyl-1-phenyl-propane-1-one, 2-ethyl anthraquinone and bis(2,4,6-trimethylbenzoyl)-phenylphosphine oxide, and (D) the at least one diol diacrylate comprises 1,9-nonanediol diacrylate.

14. The curable composition for a printed wiring board as claimed in claim 13, wherein (A) the (meth)acrylate compound is included in an amount of 10 to 45 wt. %.

15. The curable composition for a printed wiring board as claimed in claim 14, wherein (B) the (meth)acrylate compound is included in an amount of 10 to 30 parts by weight based on 100 parts by weight of the curable composition.

16. The curable composition for a printed wiring board as claimed in claim 15, wherein (C) the photopolymerization initiator is included in an amount of 0.5 to 10 wt. % with respect to the curable composition.

17. The curable composition for a printed wiring board as claimed in claim 16, wherein (D) the at least one diol diacrylate is included in an amount of 20 to 80 parts by weight based on 100 parts by weight of the composition.

18. The curable composition for a printed wiring board as claimed in claim 17, wherein (D) the at least one diol diacrylate is included in an amount of 40 to 70 parts by weight based on 100 parts by weight of the composition.

19. The curable composition for a printed wiring board as claimed in claim 17, wherein (D) the at least one diol diacrylate is included in an amount of 40 to 60 parts by weight based on 100 parts by weight of the composition.

20. The curable composition for a printed wiring board as claimed in claim 17, wherein (D) the at least one diol diacrylate is included in an amount of 50 to 55 parts by weight based on 100 parts by weight of the composition.

* * * * *